United States Patent [19]

Turner et al.

[11] Patent Number: 5,711,821
[45] Date of Patent: Jan. 27, 1998

[54] CLEANSING PROCESS FOR WAFER HANDLING IMPLEMENTS

[75] Inventors: Virgil O. Turner, Sugarland; William D. Light, Richmond; Hilario T. Trevino, Needville, all of Tex.

[73] Assignee: Texas Instruments Incorporated, Dallas, Tex.

[21] Appl. No.: 814,750

[22] Filed: Mar. 7, 1997

Related U.S. Application Data

[63] Continuation of Ser. No. 420,996, Apr. 13, 1995, abandoned.
[51] Int. Cl.⁶ .................................................. B08B 5/04
[52] U.S. Cl. ........................... 134/21; 134/30; 134/31; 134/37
[58] Field of Search ........................ 134/21, 26, 30, 134/31, 34, 37; 15/345, 346, 310

[56] References Cited

U.S. PATENT DOCUMENTS

| | | | |
|---|---|---|---|
| 3,479,679 | 11/1969 | Vogel | 134/21 |
| 4,017,330 | 4/1977 | Aidlin et al. | 134/21 |
| 4,132,567 | 1/1979 | Blackwood | 134/37 X |
| 4,828,760 | 5/1989 | Chung et al. | 134/21 X |
| 5,039,349 | 8/1991 | Schoeppel | 134/26 |
| 5,238,503 | 8/1993 | Phenix et al. | 134/27 |
| 5,279,017 | 1/1994 | Foreshew | 15/304 |
| 5,536,330 | 7/1996 | Chen et al. | 134/21 |
| 5,603,775 | 2/1997 | Sjoberg | 134/21 |

*Primary Examiner*—Jill Warden
*Assistant Examiner*—Saeed Chaudhry
*Attorney, Agent, or Firm*—Stanton C. Braden; Wade James Brady, III; Richard L. Donaldson

[57] ABSTRACT

Methods are provided for cleansing contaminants from substrates, such as semiconductor wafer handling implements, and thereby reduce the incidence of contamination of semiconductor devices being assembled upon the semiconductor wafers. In one aspect of the invention, a substrate such as a semiconductor cassette or other semiconductor wafer handling implement, is inserted into a chamber that is substantially isolated from a surrounding environment. A pressurized, and optionally purified, cleansing medium is directed against at least one surface of the substrate to dislodge contaminants from the substrate surface. Dislodged contaminants are evacuated with negative pressure from the chamber. In a preferred aspect of the invention, the cleansing medium is an inert gas, such as nitrogen, and is applied to the substrate at a pressure from about 10 p.s.i. to about 100 or more p.s.i. The chamber can be provided with sidewalls that define a convergent evacuation path that is in fluid communication with an exhaust stream, such as the exhaust stack of the manufacturing facility.

21 Claims, 2 Drawing Sheets

CLEANSING PROCESS FOR WAFER HANDLING IMPLEMENTS

This application is a Continuation of application Ser. No. 08/420,996, filed Apr. 13, 1995 now abandoned.

FIELD OF THE INVENTION

The invention relates to semiconductor manufacturing, and more particularly to the cleansing of wafer handling implements that are used incident to the manufacture of semiconductor devices.

BACKGROUND OF THE INVENTION

The manufacture of semiconductor devices is a time consuming process that requires high levels of cleanliness throughout the many phases of the manufacturing process. Many steps of manufacturing are conducted in various classes of "clean rooms" having purified air flows to reduce the incidence of airborne particle contaminants to prescribed levels. Clean rooms are typically designated in accordance with the number of permitted contaminants of a prescribed size per cubic foot of airspace. For example, much semiconductor manufacturing is presently conducted in Class 10 clean rooms, which have filtered air flows to permit no more than 10 particles per cubic foot of up to $0.5\mu$ in size. Nevertheless, wafers upon which the semiconductor devices are assembled can become contaminated, and therefore rendered defective, by contaminants that are introduced at various process steps. For example, contamination can arise from incomplete cleansing of reagents from the wafer handling apparatus, and the like. The presence of such contaminants can have a catastrophic impact on product yield, notwithstanding an otherwise proper and complete formation of the semiconductor device. Moreover, although the wafers themselves can be properly cleansed of reagents and the like that are used incident to various manufacturing steps, the wafer handling equipment, for a variety of reasons, may not be completely cleansed of the reagents and may therefore serve as source of wafer contamination for subsequent batches of wafers. Unfortunately, the prior art to date has not properly and fully addressed this latter aspect of contamination, and has instead sought to improve product yield by addressing other aspects of semiconductor device manufacture.

Prior efforts to cleanse wafer handling implements have not been entirely compatible with other aspects of device manufacture. For example, one known prior cleansing method within the clean room provided for the use of a pressurized stream of air that was directed at a wafer handling implement such as a wafer cassette or boat. While this cleansing practice was convenient and expedient, it had the unfortunate consequence of creating turbulence in the airflow within the clean room and introducing particulate contaminants into the clean room airstream, which resulted in increased particle contaminant concentrations at other processing stations within the clean room. While the spread of airborne contaminants was rectified by termination of this cleansing regimen, the cleansing regimen itself was not replaced. Therefore, the original problem associated with contaminated wafer handling implements has largely remained uncorrected. Accordingly, there exists in the semiconductor manufacturing industry a need for wafer handling cleansing methods and apparatus which remove particulate contaminants from wafer handling implements such as wafer cassettes and the like prior to their contact with wafers at various stages of manufacture. The provision of such methods and apparatus could reasonably be expected to increase product yield and therefore result in a corresponding increase in manufacturing efficiency.

SUMMARY OF THE INVENTION

Methods and apparatus are providing for cleansing contaminants from substrates, such as semiconductor wafer handling implements, and thereby reduce the incidence of contamination of semiconductor devices being assembled upon the semiconductor wafers.

In one aspect of the invention, a substrate such as a semiconductor cassette or other semiconductor wafer handling implement, is inserted into a processing chamber that can optionally be substantially isolated from a surrounding environment. A pressurized, and optionally purified, cleansing medium is directed against at least one surface of the substrate to dislodge contaminants from the substrate surface. Dislodged contaminants are evacuated with negative pressure from the chamber, thereby reducing the concentration of contaminants on the substrate. In a preferred aspect of the invention, the cleansing medium is an inert gas, such as nitrogen, which can be readily manufactured and supplied at semiconductor manufacturing sites. The cleansing medium is applied to the substrate at a pressure from about 10 p.s.i. to about 100 or more p.s.i. Such pressures have been found to be particularly suitable for removing contaminants of the type that are typically accumulated on wafer handling equipment such as wafer cassettes. The chamber can be provided with sidewalls that define a convergent evacuation path in fluid communication with an exhaust stream, such as the exhaust stack of the manufacturing facility. The exhaust stream preferably has a flow rate of at least 10 c.f.m., and preferably at least 75 c.f.m. or greater to ensure optimal evacuation of dislodged contaminants from the chamber. Exhaust stream flow rates of up to 500 c.f.m. or more can also be provided to further enhance the cleansing process. The concentration of contaminants can optionally be monitored by introducing a particle monitor in the fluid flow path of the processing or the exhaust conduit.

BRIEF DESCRIPTION OF THE DRAWINGS

The foregoing and other features and advantages of the present invention will become apparent to those skilled in the art from a reading of the accompanying detailed description of the invention, taken together with the accompanying drawings, in which.

DETAILED DESCRIPTION OF THE PREFERRED EMBODIMENTS

Figure 1:
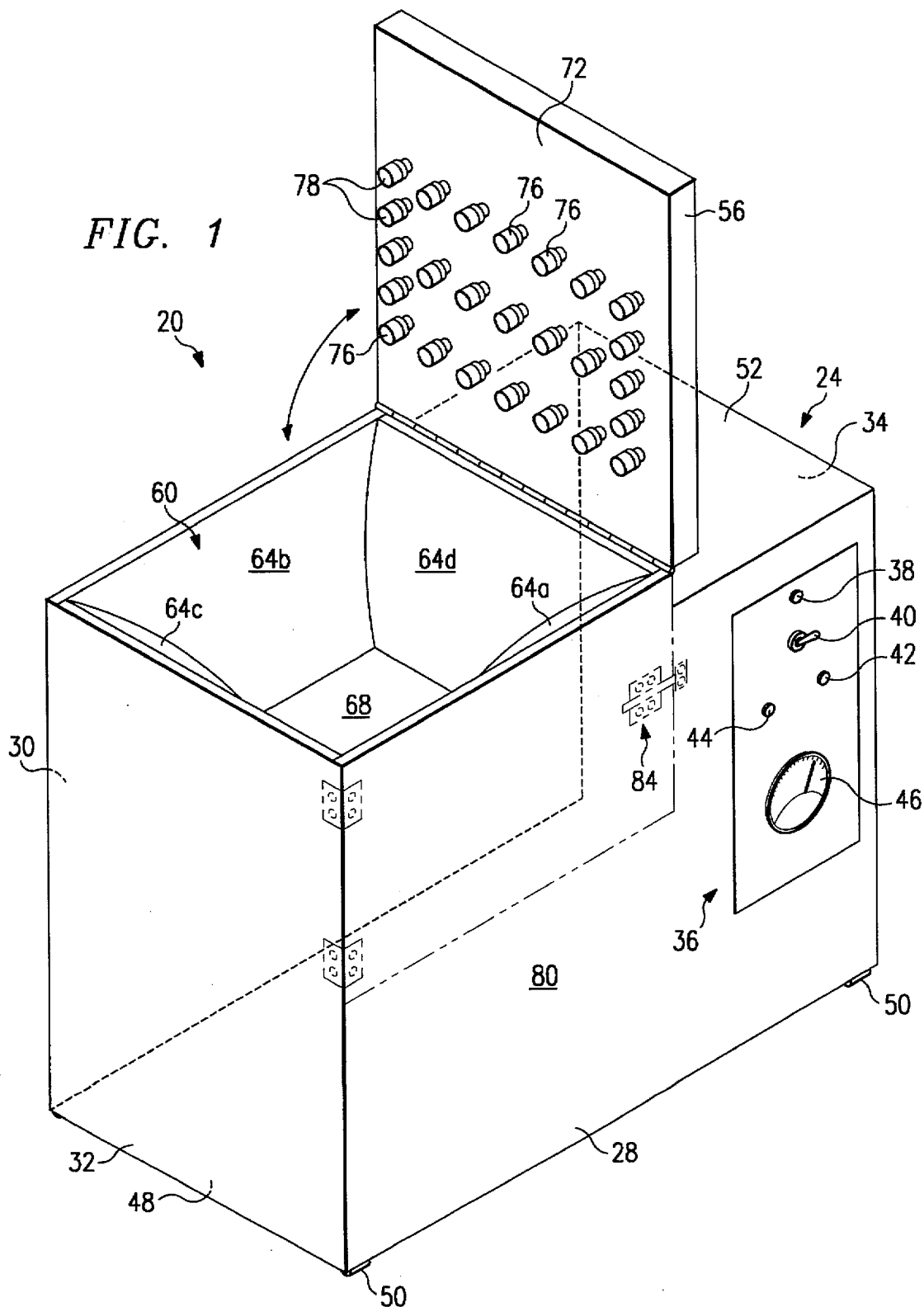
FIG. 1 is a perspective view of a cleansing instrument in accordance with the present invention.

With reference to the drawings, wherein like reference characters represent corresponding parts throughout the various views, and with particular reference to FIG. 1, there is depicted a substrate cleansing system in accordance with the teachings of the present invention, designated generally by reference character 20. The cleansing system 20 is particularly useful for cleansing implements such as wafer cassettes and the like that are used in the handling and/or processing of wafers of semiconductor material incident to the manufacture of semiconductor devices. However, it is to be appreciated that the teachings of the present invention as described below can be used to cleanse implements that are used in other manufacturing processes.

The cleansing system 20 is comprised of a housing 24 that includes opposing front and rear panels 28 and 30, and side panels 32 and 34 respectively. A control panel 36 is provided at the front panel 28 to permit for the entry of various user inputs and to display various types of information relating to various aspects of device operation. The control panel includes visible indicia of system readiness, such as a "Power" light 38, which confirms placement of a power switch 40 in an appropriate position, such as an "on" or "standby" position. A processing cycle of prescribed time duration can be initiated by appropriate manipulation of start selector 42. A cycle reset selector 44 can be manipulated in an appropriate manner to ready the system for commencement of a new processing cycle, as when conditions inhibit commencement of a cycle following actuation of "start" selector 42. As will be more fully described below, the processing system monitors various parameters to inhibit system operation in instances where prescribed conditions are not satisfied. Such parameters can include, by way of non-limiting example, cleansing medium supply line pressure and exhaust vacuum pressure, one or more of which can be displayed in an appropriate manner on the control panel 36.

The housing 24 includes a base 48 that can be supported by legs 50 which can optionally be in the form of casters, self-leveling legs, or other suitable supports. An upper surface 52 of the housing 24 includes a cover or lid 56 that is pivotably connected to a remaining portion of the upper surface by suitable means, such as a hinge coupling (not shown). The cover 56 provides access to the interior of the cleansing system 20, and more particularly, to the system processing chamber 60. The processing chamber is defined by opposed sidewalls 64a–64d which define a quadralateral, a floor 68, and the inner surface 72 of the lid 56. The sidewalls can optionally be provided with a curvalinear, as opposed to planar, configuration, as shown in the drawings. Alternatively, the processing chamber 60 can be defined by a structure, such as a circular or oval cylinder, having a curvalinear sidewall and floor. Configuration of the processing chamber in any of the foregoing manners provides a processing chamber that is substantially, although preferably not completely, isolated from the environment surrounding the cleansing system 20 for reasons that will be more fully described below.

One or more of the chamber sidewalls 64, base 68 and the inner surface 72 of the lid 56 can be formed from an electro-polished stainless steel, such as 304- or 316-grade stainless steel to facilitate the separation and removal of contaminants from a substrate received within the chamber 60. Formation of these surfaces in this manner renders a hardened, flat surface that is substantially devoid of surface irregularities, thereby facilitating the passage of dislodged contaminants there along incident to the cleansing process, as will be described in greater detail below.

An array of nozzles 76 is secured or otherwise mounted along the inner surface 72 of the lid 56 and is operable to deliver a pressurized stream of cleansing medium through nozzle apertures 78 to a substrate, such as a wafer cassette or other wafer handling implement, received within the cleansing chamber 60, as will be described in greater detail below. Optionally, one or more of the nozzles can instead be coupled to a supply (not shown) of a suitable deionizing medium to deliver the deionizing medium to the processing chamber. The nozzles 76 can be repositioned along the lid inner surface 72 in an appropriate manner in accordance with such factors as the dimensions and configuration of the substrate to be cleansed, the composition of the substrate, desired cleansing medium spray pattern, and the like.

An access door 80 that is formed within one of the front (28), rear (30) or side (30/32) walls of the system, as shown in phantom in the drawing, can optionally be provided to afford supplemental access to the processing chamber 60. Alternatively, the door 80 can be provided in lieu of the hingedly securable lid 56 to simplify the cleansing system manufacturing and reduce associated expenses. Processing chamber access from the side rather than the top can be beneficial in instances, such as when handling quartz wafer cassettes and other contaminant sensitive and/or heated or supercooled substrates, where tongs (not shown) and other special handling implements may be required. Access door 80 can be hingedly coupled to a sidewall, such as sidewall 36, and is securable in a closed position by a conventional latch or other suitable locking mechanism, such as that designated by reference character 84.

Figure 2:
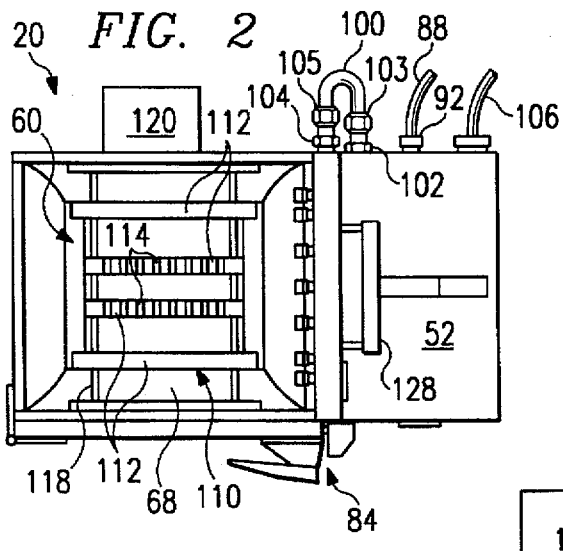
FIG. 2 is a top elevation view of the device depicted in FIG. 1 with the device cover in an "open" position to illustrate details of the device processing chamber.

Further features of the cleansing system 20 are illustrated in FIG. 2. A pressurized flow of cleansing medium is supplied to the processing chamber 60 from an associated supply tank (not shown) or, more preferably, by means of a supply line 88 that is connected to a facility reservoir. The cleansing medium is preferably in the form of a pressurized, and optionally purified, gaseous flow. Use of an inert gas is preferred so as to avoid interaction between the cleansing medium and the contaminants carried by the substrate. As Nitrogen is used in other aspects of semiconductor manufacturing and is available in highly purified concentrations, its use as a cleansing medium is particularly advantageous. However, other appropriate cleansing mediums, such as purified, dehydrated air and other fluids that are non-reactive with contaminants that may be present on a given substrate, can be substituted for the inert gas.

The cleansing medium is conveyed from its inlet connection 92 (FIG. 3) along the rear panel 30 to the nozzle array 76 (FIG. 1) through an internal conduit 96. Delivery of the cleansing medium into the conduit 96 is regulated by an appropriate flow control device, such as solenoid 98 or other precision valving device. Conduit 96 is coupled to an external, flexible hose 100 through appropriate fittings, such as high pressure threaded fittings 102, 104 that are respectively mounted to the rear wall 30 and lid 56 of the cleansing system 20. The ends of the hose 100 are provided with fittings 103 and 105 that are configured complementary to fittings 102 and 104 to securely engage the fittings 103 & 105. Electrical power is supplied by a conventional 110 volt power line 106 or by other suitable sources of electrical power. Supplied electrical power is managed and processed in an appropriate manner to provide for powering of the various system relays, circuits and control apparatus, as well as the control panel 36.

With reference to FIG. 2, there is illustrated a substrate 110 in the form of a quartz wafer cassette that is received within the processing chamber 60 of the cleansing system. While a quartz wafer cassette is discussed in the following description, it is to be understood that the principles of the invention are equally applicable to non-quartz wafer cassettes, as well as to other types of wafer handling and other, non-wafer handling implements. The wafer cassette 110 includes plurality of wafer supports 112 that are arranged parallel to one another. Each support 112 includes a plurality of transversely extending slots 114, each of which is dimensioned to receive a wafer of semiconductor material therein. In the illustrated wafer cassette 110, the number of wafer slots 114 has been greatly reduced, and the spatial dimensions of the slots have been exaggerated with respect to the dimensions and structure of conventional quartz wafer cassettes for reasons of clarity. The wafer cassette 110 is supported in the processing chamber 60 by a mounting rack 118 that is dimensioned and configured to support the substrate 110 above the processing chamber floor 68. When quartz cassettes are to be cleansed, the rack 118 is preferably formed from various resins or polytetrafluoroethylenes ("PTFE's") to avoid reaction with, or retention of, contaminants introduced into the processing chamber 60 by a substrate to be cleansed. When polypropylene and other non-quartz implements are to be cleansed, the rack 118 can be formed from an electro-polished stainless steel, such as 304- or 316-grade stainless steel.

Figure 4:
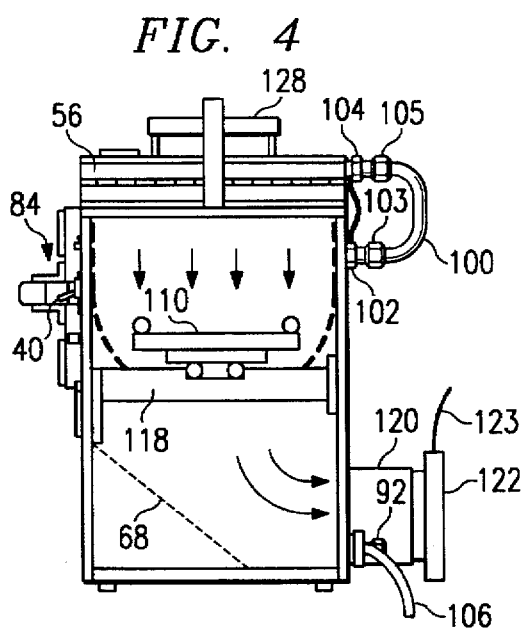
FIG. 4 is a sectional view along the line 4—4 of FIG. 1.
Figure 5:
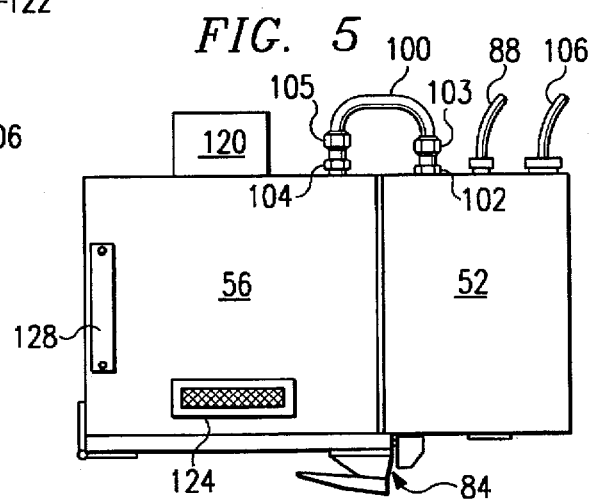
FIG. 5 is a top elevation view of the device illustrated in FIG. 1 with the device cover in a closed position.

As is illustrated more clearly in FIG. 4, the processing chamber base 68 is preferably sloped downwardly and away from the substrate 110 so as to facilitate conveyance of dislodged contaminants from the processing chamber 60 and into the exhaust stack (not shown) of the manufacturing facility. Connection to the exhaust stack is through an exhaust conduit 120 that extends from the rear wall 30 of the system. Alternatively, the exhaust conduit 120 can be positioned so as to extend from the chamber floor 68 to more fully utilize the effects of gravity. Exhaust stacks are typically continuously operable in semiconductor manufacturing facilities and generally exhibit flow rates of between 25 and 1,000 c.f.m. in accordance with, among other factors, the demands associated with various process steps. It is to be appreciated that connection to the exhaust stack creates a negative pressure within the processing chamber 60 which, in and of itself, tends to draw dislodged contaminants away from the substrate 110 and into the exhaust stack through the exhaust conduit 120. Depending on the extent of negative pressure generated by such a connection, an inlet or vent 124, as shown in FIG. 5, can optionally be provided to facilitate the ease with which the cover 56 can be elevated from the closed position shown in FIG. 5 to the open position shown in FIG. 1. Alternatively, an iris, shutter or other suitable valving device can be provided at the exhaust conduit to selectively regulate communication between the processing chamber 60 and the exhaust stock. However, provision of vent 124 is desirable, for it allows for continuous cleansing of the processing chamber with ambient clean room air. Manipulation of the lid 56 can be further facilitated through provision of a handle 128 that can be connected to the lid or incorporated therein in a conventional manner.

Figure 3:
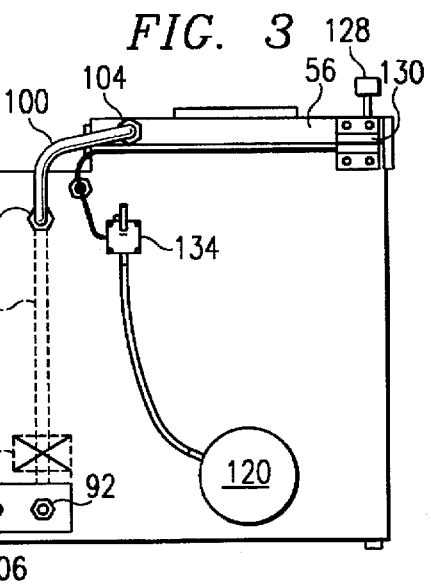
FIG. 3 is a rear view of the device depicted in FIG. 1.

Operational safeguards, such as a lid interlock switch 130 and exhaust interlock 134, as depicted in FIG. 3, can optionally be provided to facilitate safe operation of the processing system 20. For example, the lid interlock 130 can be operable to maintain the lid 56 in a closed position, as shown in FIG. 3, once the cleansing cycle has been initiated, as by depression of the start button 44 (FIG. 1), as well as to communicate with solenoid 98 to inhibit the release of pressurized cleansing fluid to the nozzles 76 in the absence of engagement of the interlock 130. Likewise, the exhaust interlock 134, which can been in the form of a diaphragm-type valve, is operable to sense negative pressure through the exhaust conduit 120 and to inhibit operation of the system in instances where the sensed negative pressure is below a predetermined threshold value.

SYSTEM OPERATION

A detailed description of the operation of the cleansing system 20 of the present invention will now be provided in connection with the cleansing of a substrate 110 in the form of a semiconductor wafer cassette, although it is to be appreciated and understood that the following description is likewise applicable for the cleansing of multiple and/or various other substrates, such as other types of semiconductor wafer handling implements, as well as other types of items for which cleansing is desirable.

With particular reference to FIGS. 1 and 2 of the drawings, a wafer cassette 110 is inserted into the processing chamber 60 for cleansing prior to use with a semiconductor wafer (not shown) at any of a variety of stages of wafer processing. The wafer cassette 110 is positioned on the rack 118 that is received within the processing chamber 60 so as to support the cassette 110 above the angled processing chamber floor 68. The rack 118 can optionally be configured to retainably engage the cassette 110 and to position the cassette in a predetermined orientation within the processing chamber 60 and with respect to the one or more rows of cleansing nozzles 76 that are provided along the inner surface of the lid 56.

Once the cassette 110 is received within the processing chamber 60 in the foregoing manner, the lid 56 is displaced from the open position (FIG. 1) to the closed position illustrated in FIG. 4, and the processing system 20 is turned on, as can be accomplished by toggling the switch 40 (FIG. 1) from the "off" position to the "on" position. Displacement of the power switch in the foregoing manner illuminates power indicator light 38, thereby confirming the delivery of power to the system. Safety interlock 130 (FIG. 3) generates appropriate signal input to confirm lid closure. In addition, appropriate signal input is provided by the exhaust interlock sensor 134, which is operable to provide "go\no go" status with respect to negative pressure supplied to the processing chamber 60 through the exhaust conduit 120. Such negative pressure is obtained from the connection of the exhaust conduit 120 to the exhaust stack of the manufacturing facility, as has been described previously. In a preferred aspect of the invention, commencement of a cleansing cycle can be accomplished only after receipt at the control panel 36 of favorable signal output from the lid interlock and exhaust interlock sensors 130 & 134, respectively, so as to inhibit operation of the cleansing system outside of prescribed operational parameters, such as incomplete lid closure and insufficient exhaust flow rate.

The cleansing cycle is started by depressing the start button 44 (FIG. 1), which initiates the release of fluid conduit solenoid valve 98, thereby freeing the flow of cleansing medium to the array of nozzles 76. While a variety of cleansing mediums can be implemented with the practice of the present invention, in a preferred aspect of the invention, the cleansing medium is gaseous nitrogen, which is typically available in semiconductor wafer manufacturing facilities in high purity. Such nitrogen is typically supplied at a line pressure of about 100 p.s.i. However, the nitrogen is preferably delivered to the nozzles 76 at a pressure of from about 10–100 p.s.i. in accordance with the structure and configuration of the nozzle outlets 78 and the number and array of nozzles. Dynamic pressure at the nozzle can be sensed in a conventional manner and indicated at the control panel pressure gauge 46. Alternatively, the gauge 46 can be connected to the supply line of the cleansing medium to provide an indication of static supply line pressure. Simultaneous displays of both of the foregoing pressures can also be provided.

The cleansing cycle is defined by a predetermined time interval, which is optimally between about 30–120 sec. at a nozzle pressure of between about 30 and 75 p.s.i. The progress of a cleansing cycle can optionally be monitored by a particle monitor 122 (FIG. 4) that is at least partially exposed to either one or both of the cleansing medium and ambient air flows introduced into the processing chamber. For example, a particle monitor 122 having an appropriate output 123 to a suitable data display (not shown) can be positioned downstream of the substrate, such as within processing chamber 60 or coupled to the exhaust conduit 120.

Tables 1 and 2 provide measured data that was obtained prior to and following processing of various types of wafer cassettes in accordance with the present invention. Table 1 provides data that was obtained with respect to three types of wafer cassettes: carrier cassettes, oven cassettes, and etch cassettes. Table 2 provides data that specifically relates to the cleansing of etching cassettes. Carrier cassettes provide for the transportation of wafers between processing sites, at which the wafers are off-loaded to other types of cassettes, such as oven cassettes and etch cassettes that are designed and fabricated for specific types of processing. For example, furnace cassettes are typically fabricated from quartz so as to withstand high temperature processing in furnaces at temperatures in excess of 800° C. Etch cassettes are formed from various acid resistant materials, such as certain plastics and members of the polytetrafluoroethylene ("PTFE") family. All of the wafer cassettes included in Tables 1 and 2 were processed under the following conditions:

Cleansing medium line pressure: 100 p.s.i.

Cycle duration: 30 seconds

Cleansing medium: gaseous nitrogen

Exhaust stack flow: 25–150 c.f.m.

TABLE 1

| Cassette Type/No. | Particle Count | |
|---|---|---|
| | Before Processing | After Processing |
| Carrier/1 | 5 | 1 |
| Carrier/2 | 19 | 11 |
| Carrier/3 | 195 | 0 |
| Carrier/4 | 15 | 8 |
| Carrier/5 | 88 | 2 |
| Carrier/6 | 27 | 12 |
| Carrier/7 | 56 | 19 |
| Carrier/8 | 29 | 40 |
| Carrier/9 | 10 | 4 |
| Carrier/10 | 73 | 1 |
| Carrier/11 | 33 | 4 |
| Oven/1 | 362 | 75 |
| Oven/2 | 239 | 17 |
| Oven/3 | 20 | 2 |
| Oven/4 | 176 | 0 |
| Oven/5 | 176 | 0 |
| Oven/6 | 41 | 0 |
| Oven/7 | 89 | 0 |
| Oven/8 | 7 | 0 |
| Etch/1 | 4 | 0 |
| Etch/2 | 2 | 1 |
| Etch/3 | 12 | 1 |
| Etch/4 | 3566 | 853 |
| Etch/5 | 3 | 3 |
| Etch/6 | 1533 | 241 |
| Etch/7 | 2367 | 449 |
| Average Pre-Processing Particle Count: | 351.8 | |
| Average Post-Processing Particle Count: | 67.1 | |
| % Particle Reduction: | 80.9 | |

TABLE 2

| Cassette Type/No. | Particle Count | |
|---|---|---|
| | Before Processing | After Processing |
| Etch/1 | 290 | 49 |
| Etch/2 | 207 | 24 |
| Etch/3 | 489 | 31 |
| Etch/4 | 18 | 2 |
| Etch/5 | 660 | 79 |
| Etch/6 | 2203 | 143 |
| Etch/7 | 631 | 222 |
| Etch/8 | 193 | 138 |
| Etch/9 | 1319 | 170 |
| Etch/10 | 1494 | 177 |
| Average Pre-Processing Particle Count: | 750 | |
| Average Post-Processing Particle Count: | 103.5 | |
| % Particle Reduction: | 86.7% | |

The empirical data obtained from the foregoing evaluations indicated an improvement in wafer cassette cleanliness of between about 80% - about 90%. Accordingly, wafers transported by the various cassettes that were cleansed in the foregoing manner were subjected to 80–90% fewer contaminants than to which they otherwise would have been subjected.

The foregoing cleansing process provided a contaminant reduction that was far greater than ever anticipated by the inventors. In related tests, the foregoing cleansing practices resulted in a yield improvement for short flow lots of between 5 and 11%, even when "best" practices, where cost was of secondary consideration, were implemented.

Although the present invention and its advantages have been described in connection with the preferred embodiments, it is to be understood and appreciated that various changes, substitutions and modifications can be made herein without departing from the scope and spirit of the invention as defined by the accompanying claims. For example, it may be desirable to provide an automated control to the processing system to permit entry of a user variable processing time to custom tailor a processing cycle in accordance with the level of cleanliness and the type of substrate to be cleansed. Alternatively, the processing system could be modified to obtain particle count data from the processing chamber exhaust to permit for processing until a desired level of exhaust air cleanliness is attained, in which case the processing cycle would not be time dependent. Moreover, the cleansing medium could optionally be applied in a discontinuous manner during the course of a processing cycle, regardless of the processing cycle parameter that is employed (i.e., particle count or elapsed time).

What is claimed:

1. A method for cleansing a substrate, comprising the following steps:

inserting a substrate into a processing chamber to substantially isolate the substrate from a surrounding environment;

applying a pressurized stream, received within said processing chamber, of a gaseous cleansing medium against at least one surface of the substrate;

simultaneously evacuating with negative pressure said cleansing medium from the chamber and disposing of said cleansing medium; and obtaining from the cleansing medium evacuated from said chamber an indication of a number of particles removed from the substrate.

2. The method according to claim 1, wherein said cleansing medium comprises an inert gas.

3. The method according to claim 1, wherein said cleansing medium is applied at a pressure of from about 10 p.s.i. to about 100 p.s.i.

4. The method according to claim 1, wherein the processing chamber is provided with sidewalls that include surfaces that are arranged along at least two intersecting planes.

5. The method according to claim 1, wherein said pressurized stream is evacuated into an exhaust stack.

6. The method according to claim 1, wherein said substrate is received by a substrate support positioned within said processing chamber.

7. The method according to claim 1, further comprising the step of drawing ambient air into said processing chamber with said negative pressure.

8. The method according to claim 1, wherein said substrate is a semiconductor wafer handling implement and said cleansing medium is applied to said implement from a plurality of discharge outlets that are positioned along one surface of said processing chamber.

9. The method according to claim 1, further comprising the step of dislodging contaminants with said pressurized stream from said substrate.

10. The method according to clam 1, wherein said cleansing medium is applied until a predetermined particle count is attained.

11. The method according to claims 1, wherein the substrate is interposed between the pressurized stream and a source of negative pressure to the processing chamber.

12. The method according to claim 1, wherein said cleansing medium travels substantially in one direction through the processing chamber.

13. A method for removing contaminants from a substrate that is used in the handling of semiconductor wafers, comprising the following steps:

inserting a substrate disposed to handle semiconductor wafers into a processing chamber that is substantially isolated from a surrounding environment;

applying a stream of purified, pressurized gaseous cleansing medium, against at least one surface of the substrate received within said processing chamber so as to dislodge a contaminant from the surface of the substrate;

simultaneously evacuating the dislodged contaminant form the processing chamber with negative pressure into an exhaust stream and disposing of said contaminant; and obtaining from the dislodged contaminant an indication of a number of particles removed from the substrate.

14. The method according to claim 13, wherein said cleansing medium comprises an inert gas.

15. The method according to claim 13, wherein said cleansing medium is applied at a pressure of from about 10 p.s.i. to about 100 p.s.i.

16. The method according to claim 13, wherein the processing chamber is provided with sidewalls that include surfaces that are arranged along at least two intersecting planes.

17. The method according to claim 13, wherein said exhaust stream is at a flow rate of at least about 10 c.f.m.

18. The method according to claim 13, wherein said cleansing medium is directed into at least one pressurized discharge outlet for application to the substrate to be cleansed.

19. The method according to claim 18, wherein the substrate is a wafer cassette having at least one wafer-receiving slot and said discharge outlet is operable to direct said cleansing medium into said wafer slot.

20. The method according to claim 9, further comprising the step of measuring contaminant concentration with said chamber.

21. The method according to claim 9, wherein said cleansing medium is applied until a predetermined particle count is attained.

* * * * *